US009575862B1

(12) United States Patent
Hutton et al.

(10) Patent No.: US 9,575,862 B1
(45) Date of Patent: Feb. 21, 2017

(54) INTEGRATED CIRCUITS WITH ERROR HANDLING CAPABILITIES

(71) Applicant: Altera Corporation, San Jose, CA (US)

(72) Inventors: Michael David Hutton, Mountain View, CA (US); Dalon L. Westergreen, Alameda, CA (US)

(73) Assignee: Altera Corporation, San Jose, CA (US)

( * ) Notice: Subject to any disclaimer, the term of this patent is extended or adjusted under 35 U.S.C. 154(b) by 121 days.

(21) Appl. No.: 14/333,408

(22) Filed: Jul. 16, 2014

Related U.S. Application Data

(60) Provisional application No. 61/933,772, filed on Jan. 30, 2014.

(51) Int. Cl.
*H04L 1/00* (2006.01)
*G06F 11/30* (2006.01)
*G06F 11/07* (2006.01)

(52) U.S. Cl.
CPC ......... *G06F 11/3031* (2013.01); *G06F 11/079* (2013.01)

(58) Field of Classification Search
CPC ..................................................... H04L 1/0061
USPC ................................ 714/799, 719, 718, 746
See application file for complete search history.

(56) References Cited

U.S. PATENT DOCUMENTS 6,401,217 B1 6/2002 Clark et al.
6,701,480 B1 3/2004 Karpuszka et al.
7,019,999 B1 * 3/2006 Srinivasan ............ G11C 15/04 365/168
7,237,156 B1 * 6/2007 Srinivasan ............ G11C 15/00 365/49.15
7,328,365 B2 2/2008 Karpuszka et al.
8,134,567 B1 3/2012 Riach et al.
2004/0120173 A1 * 6/2004 Regev ................ G06F 11/1064 711/105

* cited by examiner

*Primary Examiner* — Fritz Alphonse
(74) *Attorney, Agent, or Firm* — Treyz Law Group, P.C.

(57) ABSTRACT

A logic design may include control and datapath circuitry. The datapath circuitry may be implemented in a double modular redundancy arrangement that generates respective first and second data signals. The control circuitry may be implemented in a triple modular redundancy arrangement. Storage circuitry may be used to buffer the first and second data signals. Real-time error detection circuitry may perform real-time error detection operations on the first and second data signals. Background error checking circuitry may perform background error checking operations such as cyclic redundancy check calculations on configuration data. In response to an error detected by the real-time error detection circuitry, the circuitry may select between the buffered first and second data signals to produce the output data signal. The selection may be performed based on the background error checking operations and may be delayed relative to the real-time detection of the error.

20 Claims, 7 Drawing Sheets

10
14
18
PROGRAMMABLE LOGIC
20
16
12

INTEGRATED CIRCUITS WITH ERROR HANDLING CAPABILITIES

This application claims the benefit of and claims priority to provisional patent application No. 61/933,772, filed Jan. 30, 2014, which is hereby incorporated by reference herein in its entirety.

BACKGROUND

This relates to integrated circuits such as programmable integrated circuits.

Programmable integrated circuits are well known. Programmable integrated circuits can be programmed by a user to implement a desired custom logic function. In a typical scenario, a logic designer uses computer-aided design (CAD) tools to design a custom logic circuit. When the design process is complete, the tools generate configuration data. The configuration data is loaded into programmable integrated circuit memory elements to configure the device to perform the functions of the custom logic circuit. In particular, the configuration data configures programmable interconnects, programmable routing circuits, and programmable logic circuits in the programmable integrated circuits.

It is often desirable to provide circuitry on an integrated circuit with error resiliency. For example, operational errors such as caused by transistor aging or soft error upsets may result in incorrect circuit functionality. To help provide error resiliency, circuitry is sometimes implemented using double modular or triple modular redundancy in which multiple copies of the circuitry are implemented. However, double modular redundancy merely detects the existence of errors and is not capable of correcting the detected errors. Triple modular redundancy is capable of correcting detected errors, but is expensive and requires three times the circuit resources of arrangements in which no redundancy is used.

In some scenarios, background error-detection circuitry using cyclic redundancy checks (CRCs), checksum, parity, or other error-detection code methods are performed. Background cyclic redundancy checks involve sequentially reading configuration data from each programmable element and computing cyclic redundancy checks to validate the data. Programmable elements with incorrect CRC values may be re-loaded with configuration data before a system reboot is performed to restore correct operations. However, a significant delay (e.g., hundreds of milliseconds) is required to load configuration data and reboot the system, during which the circuitry is operating incorrectly and may produce invalid data. Similarly, circuitry may be provided so that the configuration is re-written with correct data, or scrubbed. However, this incurs additional delay (e.g. tens of milliseconds).

SUMMARY

An integrated circuit design for circuitry on an integrated circuit may include multiple classes of circuitry. The circuitry classes may include first and second classes having different levels of error sensitivity. The first class may be a class such as a control circuitry class that is more sensitive to errors. The second class may be a class such as a datapath circuitry class that may be less sensitive to errors than the first class. Datapath circuitry of the second class may be implemented as first and second duplicate datapath circuits that generate respective first and second data signals. Control circuitry of the first class may be implemented in a triple modular redundancy arrangement that provides control signals to the datapath circuits. Storage circuitry may be used to buffer the first and second data signals. Real-time error detection circuitry may perform real-time error detection operations on the first and second data signals. Background error checking circuitry may perform background error checking operations such as cyclic redundancy check calculations on configuration data. In response to an error detected by the real-time error detection circuitry, the circuitry may select between the buffered first and second data signals to produce the output data signal. The selection may be performed based on the background error checking operations and may be delayed relative to the real-time detection of the error. Implementation of datapath circuits, which typically occupy a majority of available circuit resources, using double modular redundancy may be used to help provide real-time error detection. Use of background error checking operations in combination with real-time error detection may provide error correction capabilities with reduced resource usage.

Further features of the invention, its nature and various advantages will be more apparent from the accompanying drawings and the following detailed description of the preferred embodiments.

DETAILED DESCRIPTION

The present invention relates to programmable integrated circuits that have error detection and recovery capabilities.

Figure 1:
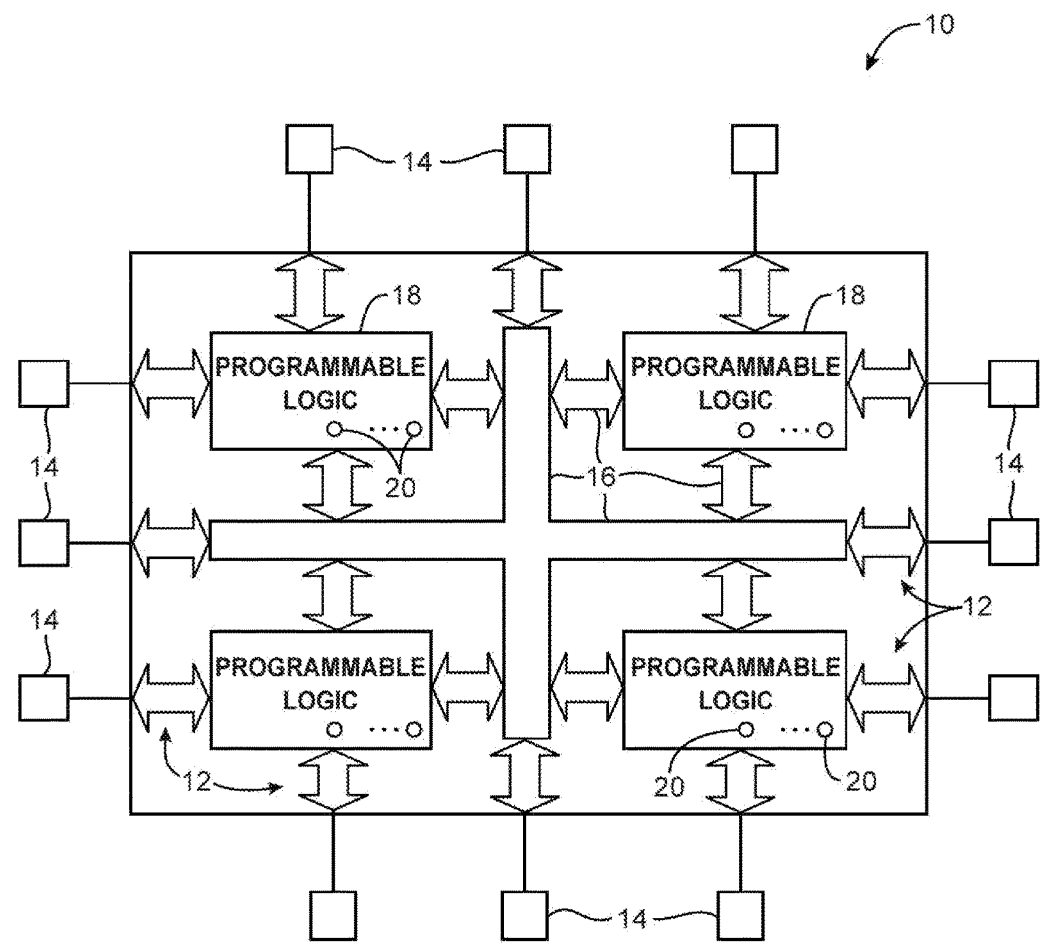
FIG. 1 is an illustrative diagram of a programmable integrated circuit with programmable logic in accordance with an embodiment of the present invention.

FIG. 1 shows a diagram of an illustrative programmable integrated circuit device. As shown in FIG. 1, device 10 may have input-output (I/O) circuitry 12 for driving signals off of device 10 and for receiving signals from other devices via input-output pins 14. Interconnection resources 16 such as global and local vertical and horizontal conductive lines and buses may be used to route signals on device 10. Interconnection resources 16 include fixed interconnects (conductive lines) and programmable interconnects (i.e., programmable connections between respective fixed interconnects). Interconnection resources 16 may sometimes be referred to herein as interconnects (e.g., interconnects formed from combinations of fixed interconnects and programmable interconnects).

Interconnects 16 may be used to interconnect regions of programmable logic such as programmable logic regions 18. Programmable logic regions 18 may sometimes be referred to as logic array blocks or programmable circuit regions. Programmable logic regions 18, may, if desired, contain groups of smaller logic regions. These smaller logic regions, which may sometimes be referred to as logic elements or adaptive logic modules, may be interconnected using local interconnection resources.

Programmable logic regions 18 may include combinational and sequential logic circuitry. For example, programmable logic regions 18 may include look-up tables, registers, and multiplexers. Programmable logic regions 18 may be configured to perform a custom logic function.

Programmable logic regions 18 contain programmable elements 20. Programmable elements 20 may be based on any suitable programmable technology, such as fuses, antifuses, electrically-programmable read-only-memory technology, random-access memory cells, mask-programmed elements, etc. As an example, programmable elements 20 may be formed from memory cells. During programming, configuration data is loaded into the memory cells using pins 14 and input-output circuitry 12. The memory cells are typically random-access-memory (RAM) cells. Because the RAM cells are loaded with configuration data, they are sometimes referred to as configuration RAM cells (CRAM).

Programmable elements 20 may be used to provide static control output signals for controlling the state of logic components in programmable logic 18. The output signals generated by elements 20 are typically applied to gates of metal-oxide-semiconductor (MOS) transistors (sometimes referred to as pass gate transistors).

The circuitry of device 10 may be organized using any suitable architecture. As an example, logic 18 of programmable device 10 may be organized in a series of rows and columns of larger programmable logic regions, each of which contains multiple smaller logic regions. The logic resources of device 10 may be interconnected by interconnection resources 16 such as associated vertical and horizontal conductors. These conductors may include global conductive lines that span substantially all of device 10, fractional lines such as half-lines or quarter lines that span part of device 10, staggered lines of a particular length (e.g., sufficient to interconnect several logic areas), smaller local lines, or any other suitable interconnection resource arrangement. If desired, the logic of device 10 may be arranged in more levels or layers in which multiple large regions are interconnected to form still larger portions of logic. Other device arrangements may use logic that is not arranged in rows and columns.

Figure 2:
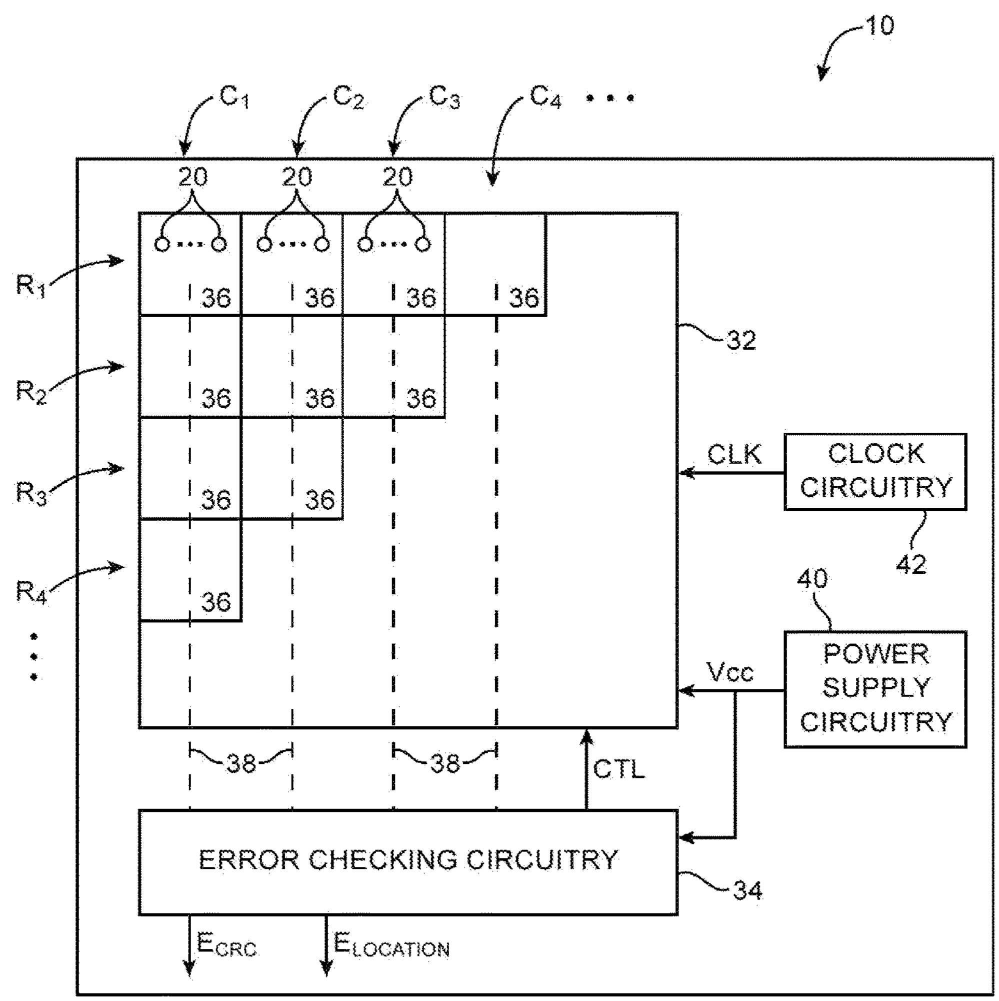
FIG. 2 is an illustrative diagram of a programmable integrated circuit with background error checking circuitry in accordance with an embodiment of the present invention.

Integrated circuits such as programmable integrated circuits may sometimes experience faulty operations or errors. For example, transient errors such as soft errors may be caused by alpha or neutron particles that strike circuitry on the integrated circuit. As another example, permanent faults in the integrated circuitry may be caused by aging effects such as electro-migration or negative-bias temperature instability (NBTI). Errors in a programmable integrated circuit can occur in dedicated circuitry or programmable circuitry such as the programmable elements used in implementing custom user logic (e.g., CRAMs). To improve resiliency against operational errors, the integrated circuits may be provided with error checking circuitry. FIG. 2 is an illustrative diagram of a programmable integrated circuit with background error checking capabilities.

As shown in FIG. 2, integrated circuit 10 may include programmable circuitry 32 and error checking circuitry 34. Programmable circuitry 32 may, for example, include programmable logic regions 18, interconnect circuitry 16, and/or input-output circuitry 12 of FIG. 1. Programmable circuitry 32 is partitioned into regions 36. Each region 36 includes one or more programmable elements 20 and is coupled to error checking circuitry 34 via paths 38. Regions 36 may be organized in rows (e.g., rows R1, R2, R3, R4) and columns (e.g., columns C1, C2, C3, and C4). Circuitry such as programmable circuitry 32 and error checking circuitry 34 on integrated circuit 10 may receive power supply voltage VCC from power supply circuitry 40 that supplies power for circuit operations. Clock circuitry 42 may provide clock signals such as signal CLK that may be used for synchronous operation of circuitry 32.

Error checking circuitry 34 may continuously or periodically perform error checking operations in verifying the configuration data stored in programmable elements 20 of regions 36. The operations of error checking circuitry 34 may run in the background of normal operations of programmable circuitry 32 (e.g., error checking circuitry 34 may operate independently of programmable circuitry 32).

As an example, error checking circuitry 34 may retrieve the configuration data stored in programmable elements 20 over paths 38 and compute cyclic redundancy checks (CRCs) for the retrieved configuration data. Such cyclic redundancy checks may be referred to as error-detect cyclic redundancy checks (EDCRCs). In response to detecting an error at a programmable element, error checking circuitry 34 may assert an output signal ECRC identifying that an error occurred and output signal ELOCATION identifying the location of the error. Location data ELOCATION may include the row and column of the corresponding region 36. Error checking circuitry 34 may additionally perform error correction operations such as rewriting that programmable element with correct configuration data (sometimes referred to as scrubbing the programmable element). Rewriting some programmable elements during normal operation of other circuitry on an integrated circuit may sometimes be referred to as partial reconfiguration or dynamic partial reconfiguration.

The above example is merely illustrative. In general, background error checking operations may include calculating error-detecting codes such as cyclic redundancy checks, checksums, parity values, or any desired error-detecting codes. The error-detecting codes may be calculated from configuration data stored in programmable elements and used in validating the configuration data.

Figure 3:
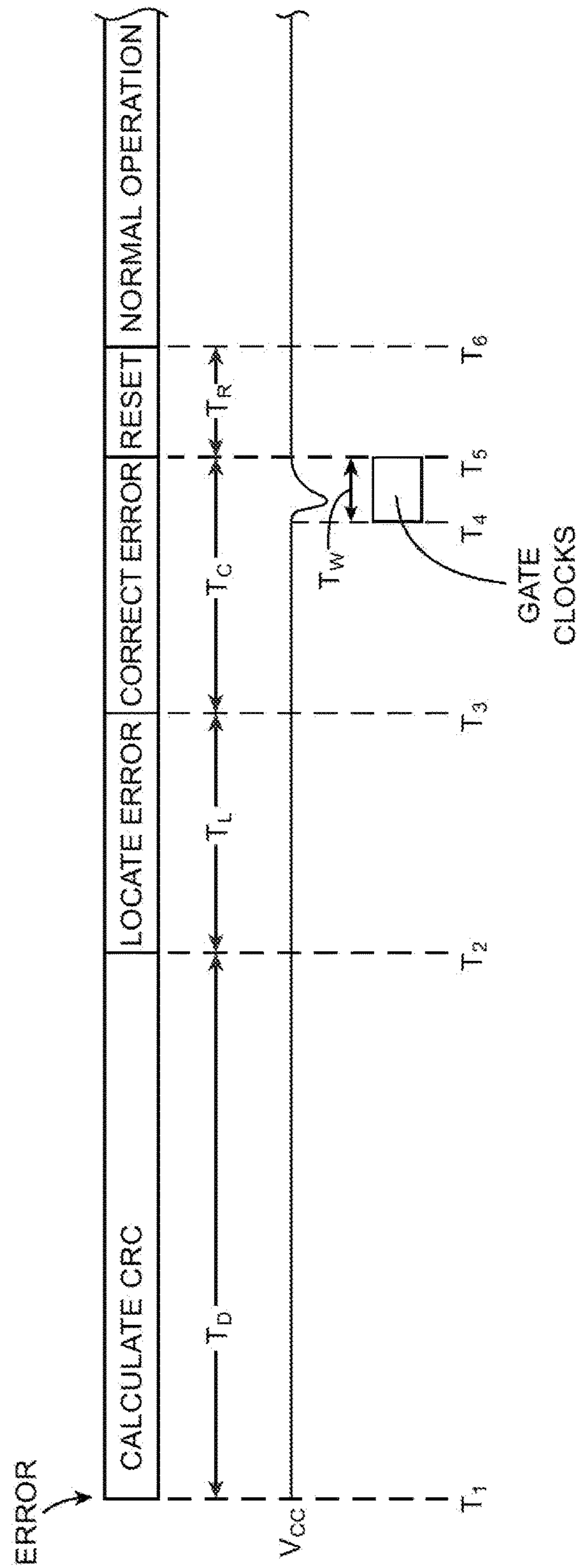
FIG. 3 is an illustrative diagram showing how background error checking operations may be performed in accordance with an embodiment of the present invention.

FIG. 3 is a diagram of illustrative steps involved in performing background error checking and correction operations on programmable circuitry 32 using background error checking circuitry 34 of FIG. 2. At time T1, an error may occur at one of the programmable elements 20. Between times T1 and T2, error checking circuitry 34 may calculate cyclic redundancy checks for the configuration data stored at the programmable elements of programmable circuitry 32 (e.g., as part of a continuously running background process).

As an example, error checking circuitry 34 may calculate a cyclic redundancy check for each programmable element sequentially across columns and rows. In this scenario, the configuration data of programmable elements 20 of region 36 at column C1 of row R1 may be retrieved, one or more corresponding cyclic redundancy check values may be calculated, and the calculated values may be compared to reference values to determine whether the configuration data of the programmable elements 20 is correct. Subsequently, background error checking circuitry 34 may validate the configuration data at column C2 of row R1, the configuration data at column C3 of row R1, and the remaining columns and rows of programmable circuitry 32. Time period TD between error occurrence and error detection may be dependent on the operating frequency of error checking circuitry 34 and the number of rows or regions 36 to be checked. For example, time period TD may be about ten milliseconds or on the order of milliseconds.

At time T2, error checking circuitry 34 may detect the error that occurred at time T1 (e.g., during verification of the region 36 that contains the given programmable element 20). For time period TL between times T2 and T3, error checking circuitry 34 may calculate the specific location of the error (e.g., which programmable element is incorrect). Time period TL may, for example, be about 10 microseconds or about one order of magnitude less than time period TD.

At time T3, error checking circuitry 34 may have identified the location of the error and may initialize error correction operations that are performed for time period TC between times T3 and T5. Error checking circuitry 34 may correct the error by rewriting the configuration data at the location of the error with correct values (e.g., scrubbing the programmable elements).

The process of rewriting the configuration data at programmable elements may cause substantial loading at power supply circuitry 40 of FIG. 2. For example, driving interconnects with configuration data to write a programmable element may draw a substantial amount of current that can temporarily reduce power supply voltage VCC for time period TW between times T4 and T5 (e.g., because the power supply voltage circuitry may not be able to immediately provide the required power). A reduced power supply voltage may cause circuitry such as transistors in regions 36 to operate with increased delay and potentially result in timing failure and incorrect operation.

For time period TW between times T4 and T5 while power supply voltage is reduced, error checking circuitry 34 may provide a control signal that temporarily delays or throttles the operations of circuitry 32. For example, error checking circuitry 34 may provide a control signal that directs clock circuitry 42 to gate clock signals that are provided to sequential elements such as registers or flip-flops of circuitry 32. By throttling the operations of circuitry 32, error checking circuitry 34 may help ensure data integrity even when signals are delayed due to reduced power supply voltage.

At time T5, the programmable elements may have been loaded with correct configuration data and error checking circuitry 34 may initiate a reset that is performed during time period TR between times T5 and T6. The reset may be only a partial reset of the programmable elements at which the error occurred. For example, the corresponding region 36 may be reset or restarted while other regions 36 may continue to operate normally. In some scenarios, the entire system may be reset. For example, the location of the error determined during time period TL may be used in determining whether a full or partial reset is necessary. Errors that occur in more critical locations (e.g., that could have potentially caused incorrect operations across multiple regions 36 or that cannot be recovered from normally) may require full re-configuration, whereas less-critical errors may require only a soft system reset.

At time T6, reset operations may be complete and normal operations for the reset regions may resume.

Background error checking operations such as CRC checks performed by error checking circuitry 34 have delayed responses to errors. For example, an error at circuitry that occurs at time T1 may not be identified until time T2. During the time period from time T1 to time T6, data produced by the incorrectly operating circuitry may be invalid. As an example, error identification time period TD may be 10 ms, error locating time period TL may be 10 us, error correction time period TC may be 10 us, and a partial reset time period TR may be 100 ns with the time period between T1 and T6 being the sum of TD, TL, TC, and TR. It may therefore be desirable to provide integrated circuit 10 with additional error handling capabilities.

Figure 4:
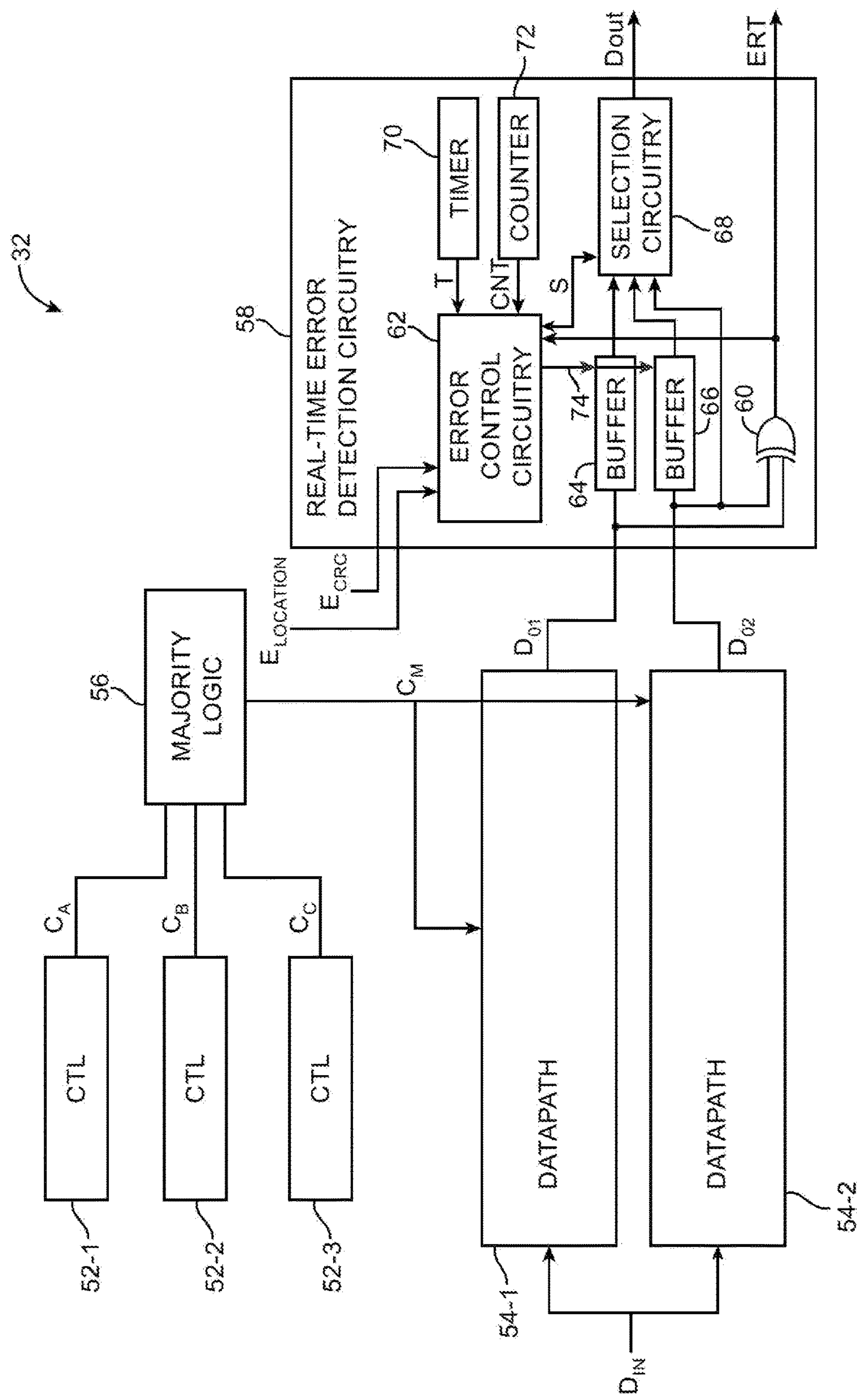
FIG. 4 is an illustrative diagram of circuitry that may be monitored by real-time error detection circuitry in accordance with an embodiment of the present invention.

FIG. 4 is a diagram showing how circuitry 32 of FIG. 2 may be provided with additional error handling capabilities. As shown in FIG. 4, custom user logic may be partitioned into different classes of circuitry based on error sensitivity (i.e., how sensitive the operations of circuitry 32 are to errors that occur in circuitry of a particular class). In the example of FIG. 4, circuitry that performs control operations is assigned to a first circuitry class of increased error sensitivity, whereas datapath circuitry is assigned to a second circuitry class of reduced error handling requirements. This example is merely illustrative. In general, regions of circuitry 32 may be partitioned into any desired number of classes based on error handling requirements.

In the example of FIG. 4, datapath circuitry 54 of the second circuitry class may process one or more input data signals DIN based on control signals generated from control circuitry 52 of the first circuitry class. In this scenario, control circuitry 52 may require increased error handling capabilities, because errors in control circuitry 52 can undesirably affect control circuitry 52 and datapath circuitry 54. In contrast, errors in datapath circuitry 54 may affect datapath circuitry 54 without causing errors in the operations of control circuitry 52 (e.g., because control circuitry 52 does not operate based on signals produced by datapath 54).

Control circuitry 52 may include multiple copies of control logic. In the example of FIG. 4, control circuitry 52 includes three control logic circuits 52-1, 52-2, and 52-3 that independently produce respective control signals CA, CB, and CC that are provided to majority logic 56. Majority logic 56 may perform majority voting operations on input control signals CA, CB, and CC to produce control signal CM (e.g., CM is asserted when two or more of the input control signals are asserted and de-asserted when two or more of the input control signals are de-asserted). The arrangement of FIG. 4 in which three identical copies of control logic are used in a majority voting scheme is sometimes referred to as triple modular redundancy (TMR). Triple modular redundancy may be provided for each control signal such as signal CM that is provided to datapath circuitry 54.

The triple modular redundancy arrangement for control circuitry 52 helps to ensure correct control operations, because errors must occur simultaneously at least two of control circuits 52-1, 52-2, and 52-3 for an error to occur at output control signal CM. Such an arrangement requires approximately three times the resources and circuit area originally utilized by a circuit. However, control circuitry 52 may be critical to correct system functionality and may occupy a relatively small portion of the total circuit area (e.g., relative to datapath circuitry 54 that may occupy a majority of the total circuit area).

To help conserve limited circuit resources while providing real-time error detection, two copies of user datapath logic may be provided in a double modular redundancy (DMR) arrangement. Datapath circuits 54-1 and 54-2 may produce respective data output signals DO1 and DO2 based on input data signal DIN and control signals such as signal CM. Real-time error detection circuitry 58 may be coupled to the outputs of datapath circuits 54-1 and 54-2 and produce real-time error signal ERT and data output signal DOUT based on data signals DO1 and DO2.

Error detection circuitry 58 may assert output signal ERT in response to detecting an error in data signals DO1 or DO2. In the example of FIG. 4, error detection circuitry 58 includes XOR gate 60 that receives data signals DO1 and DO2 and asserts signal ERT if data signals DO1 and DO2 do have matching values (e.g., if datapaths 54-1 and 54-2 produce different outputs). The ERT signal may identify that an error has occurred at one of the datapaths.

Error detection circuitry 58 may include error control circuitry 62 that receives signals from background error checking circuitry (e.g., ELOCATION and ECRC from circuitry 34 of FIG. 2) and receives signal ERT. Based on the received signals, control circuitry 62 may control the operations of buffer 64, buffer 66, selection circuitry 68, timer 70, and counter 72 in producing output signal DOUT from datapath signals DO1 and DO2.

Buffers 64 and 66 (e.g., storage circuitry) may receive and buffer respective data signals DO1 and DO2 from datapaths 54-1 and 52-2. If desired, buffers 64 and 66 may be omitted and data signals DO1 and DO2 may be temporarily stored in external memory such as double data rate (DDR) memory. Error control circuitry 62 may provide control signals to buffers 64 and 66 over paths 74 that enable or disable buffering of data signals. For example, error control circuitry 62 may enable or otherwise initiate data buffering in response to assertion of the ERT signal. Data buffers 64 and 66 may have any desired capacity. For example, data buffers 64 and 66 may be provided or configured with an amount of storage capacity based on the rate at which datapaths 54 produce data and the time required for background error processes to detect and locate errors (e.g., times TD and TL of FIG. 3) to help ensure that data is not lost.

Selection circuitry 68 may receive the buffered data signals from buffers 64 and 66. Selection circuitry 68 may, if desired, directly receive data signals from datapaths 54. In the example of FIG. 4, selection circuitry 68 receives data signal DO2 from datapath 54-2. In this scenario, selection circuitry 68 may receive control signal S from error control circuitry 62 that directs selection circuitry 68 to select one of the received data signals and output the selected data signal as output data signal DOUT. Control circuitry 62 may generate control signal S based on signals ERT, ELOCATION, and ECRC.

Error detection circuitry 58 may include counter circuitry 72. Error control circuitry 62 may control counter circuitry 72 to produce output CNT that represents how many times signal ERT has been asserted. For example, error control circuitry 62 may provide a control signal to counter 72 that directs counter 72 to increment the value of signal CNT in response to each assertion of signal ERT. Control circuitry 62 may reset the counter value at the completion of error operations in response to detection of an error (e.g., when the error has been corrected). The counter value may be used to help identify scenarios such as permanent errors (e.g., based on high counter values) or transient errors such as soft errors or metastability (e.g., based on low counter values).

Error detection circuitry may include timer circuitry 70 that produces timer value T. Error control circuitry 62 may operate timer 70 to establish an expected window of time for background error checking operations to detect and locate an error (e.g., the sum of times TD and TL of FIG. 3). For example, timer 70 may count down from a value that represents the sum of times TD and TL. Timer circuitry 70 may be used to help identify scenarios in which a real-time mismatch between data signals DO1 and DO2 is detected, but background error checking operations fails to detect or locate any errors.

The example of FIG. 4 and described herein in which control circuitry is implemented using triple modular redundancy and datapath circuitry is implemented using double modular redundancy is merely illustrative. In general, circuitry in a design may be partitioned into different classes. A first class of circuitry may be high-priority, error-sensitive and/or perform time-sensitive operations. For example, control circuitry may be assigned to the first class of high-priority circuitry. Circuitry that is assigned to the first class may be implemented using error correction circuitry such as triple modular redundancy that is capable of identifying and correcting errors in real time. A second class of circuitry may be error-sensitive but may be able to accommodate operational delays (e.g., as long as the operations are functionally correct). For example, datapath circuitry may be assigned to the second class of circuitry. Circuitry that is assigned to the second class may be implemented using error correction circuitry that identifies and buffers errors in real time (e.g., double modular redundancy with real-time error detection circuitry 58) in combination with background error checking circuitry. If desired, a third class of circuitry may be defined for which no error correction is provided. For example, error detection circuitry, input-output (I/O) circuitry, or other circuitry may be assigned to the third class. Illustrative examples described herein may refer to arrangements in which control circuitry is assigned to the first class, datapath circuitry is assigned to the second class, and error detection circuitry is assigned to the third class.

Figure 5:
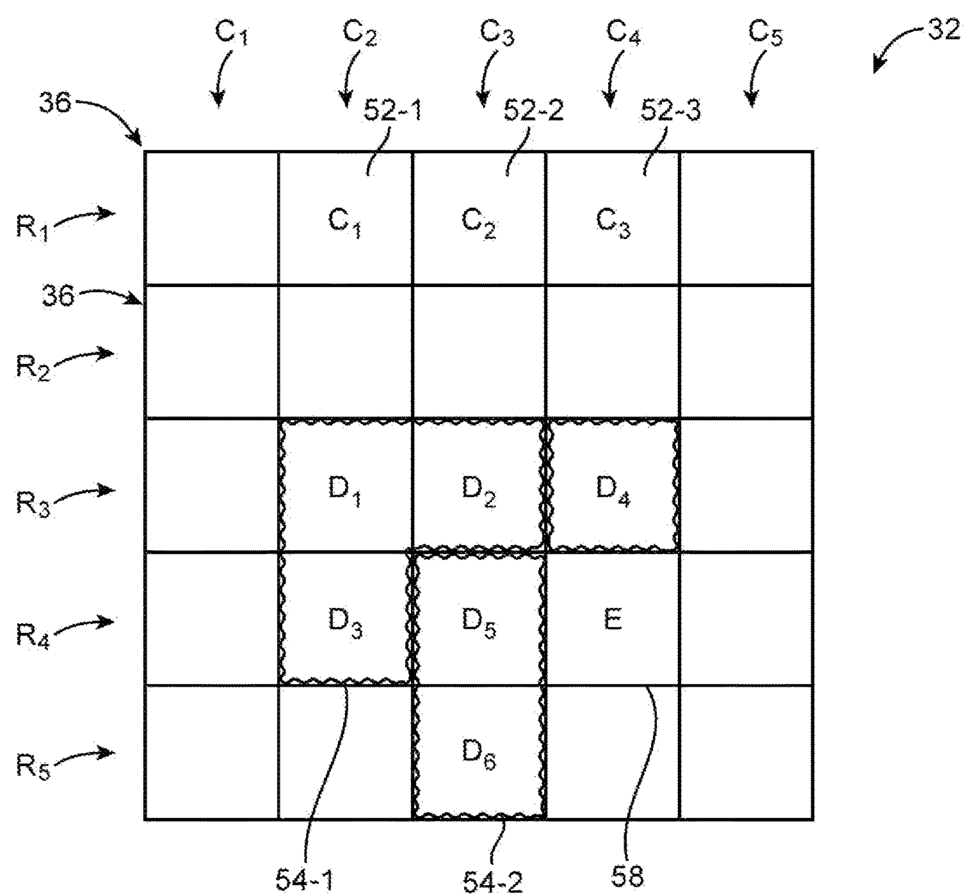
FIG. 5 is an illustrative diagram showing how control, datapath, and error circuitry may be partitioned and implemented using different logic regions in accordance with an embodiment of the present invention.

The arrangement of FIG. 4 in which double modular redundancy and real-time error detection circuitry 58 is provided for datapaths may be combined with background error checking circuitry 34 of FIG. 2 to identify and correct errors. Errors detected in real-time by error detection circuitry 58 may be located by identifying which region 36 of circuitry 32 has errors (e.g., fails CRC checks). To allow errors to be differentiated between datapaths, the circuitry of each datapath may be partitioned and implemented using different regions 36. FIG. 5 is an illustrative diagram showing how circuitry 32 of FIG. 4 may be implemented using programmable regions 36 to help accommodate background error checking operations. In the example of FIG. 5, circuitry 32 has been partitioned into a five by five grid of regions 36 (e.g., rows R1-R5 and columns C1-C5).

As shown in FIG. 5, respective programmable regions 36 are configured as control regions C1, C2, and C3, datapath regions D1, D2, D3, D4, D5, and D6, and error detection region E. Control regions C1, C2, and C3 may implement control circuits 52-1, 52-2, and 52-3 of FIG. 4, respectively. Similarly, error detection region E may be used in implementing error detection circuitry 58. Datapath circuitry 54-1 may be implemented by data regions D1, D2, and D3 (e.g., three regions 36), whereas datapath circuitry 54-2 may be implemented by data regions D4, D5, and D6. In general, any desired number of programmable regions 36 may be used in implementing error detection circuitry or custom user logic such as control or datapath circuitry.

By implementing independent datapaths using different logic regions 36, background error checking operations may be able to identify and differentiate between errors that occur at different datapaths. For example, each programmable element of circuitry 32 may be assigned an address based on the row and columns of the region 36 in which the programmable element is located. In this scenario, background error checking circuitry 34 of FIG. 2 may compute CRCs for the programmable elements and identify errors along with the location of the error. For example, error checking circuitry 34 may identify the address of the programmable element and/or the row and column of the corresponding programmable region 36 as part of an output memory map.

Consider the scenario in which an error is detected at row R3 and column C3 of circuitry 32. In this scenario, the location of the error (row R3, column C3) may be provided to real-time error detection circuitry 58 via signal ELOCATION. Control circuitry 62 of error detection circuitry 58 may be configured to map the location of the error to the corresponding circuitry. In this case, row R3 and column C3 maps to datapath circuitry 54-1 and control circuitry 62 may determine that the error occurred at datapath 54-1. Control circuitry 62 may additionally determine that buffered data from datapath 54-2 is correct and should be selected by selection circuitry 68 as output signal DOUT. By using double modular redundancy for datapaths and a partitioned layout in addition to providing real-time error detection and background error checking operations, circuitry 32 may be able to provide improved error resiliency at reduced cost (e.g., because error detection circuitry and double modular redundancy for datapaths may require fewer circuit resources than triple modular redundancy for datapaths).

Figure 6:
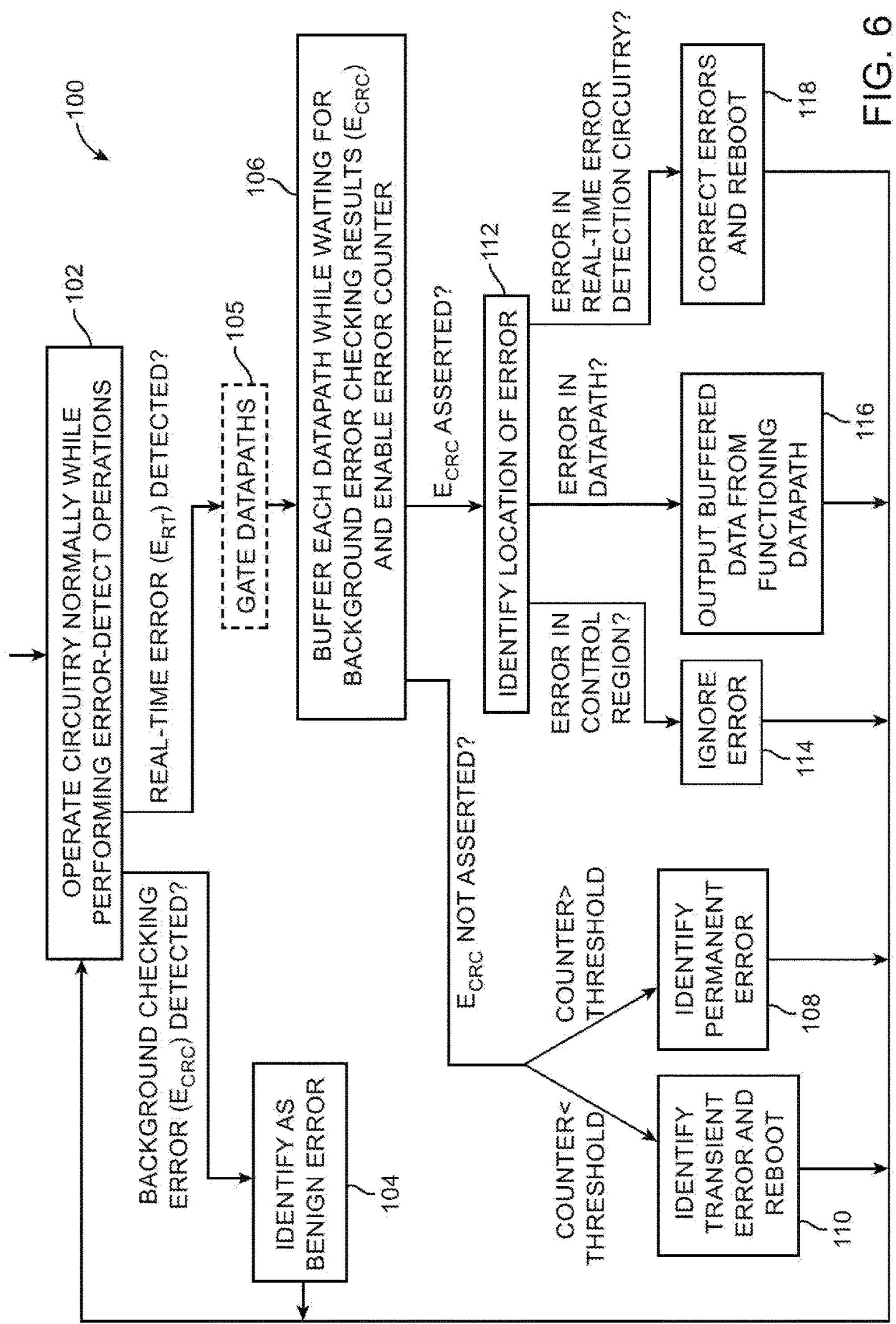
FIG. 6 is a flowchart of illustrative steps that may be performed to provide error resiliency using real-time and background error handling circuitry in accordance with an embodiment of the present invention.

FIG. 6 is a flow chart 100 of illustrative steps that may be performed to identify and correct errors on custom user logic partitioned into triple modular redundancy control regions and double modular redundancy datapath regions (e.g., as shown in FIG. 5). The operations of flow chart 100 may be performed using real-time error checking circuitry and background error detection circuitry such as circuitry 58 of FIG. 4 and circuitry 34 of FIG. 2.

During step 102, the control and datapath circuitry of the custom user logic may operate normally in processing input data to produce output data. For example, control circuitry 52-1, 52-2, and 52-3 of FIG. 4 may produce control signals that control datapath circuits 54-1 and 54-2 to process input data DIN to produce output data DO1 and DO2. Control circuitry 62 of real-time error detection circuitry 58 may provide control signal S to selection circuitry 68 that directs selection circuitry 68 to select output signal DO2 from datapath 54-2 as data output signal DOUT. This example is merely illustrative. If desired, data output signal DO1 may be routed to selection circuitry 68 and used as the default signal to be selected as data output signal DOUT during normal operation.

Background error checking operations such as CRC validation performed by background error checking circuitry may be performed continuously or periodically. In response to detection of a background checking error without any real-time errors (e.g., ECRC is asserted while ERT remains de-asserted), error control circuitry may determine that the error is benign during step 104 and subsequently return to step 102. The error may be benign because, even though configuration data may be incorrect (as identified by ECRC), the data produced by datapaths DO1 and DO2 match (as identified by ERT) and the error has not caused incorrect functionality.

In response to detection of a real-time error during step 102, optional step 105 may be performed or the process may proceed directly to the operations of step 106.

During optional step 105, the error control circuitry may gate or otherwise delay datapath operations. For example, control circuitry 62 may provide control signals to clock circuitry 42 of FIG. 2 over control paths. The control signals may direct the clock circuitry 42 to gate clock signals such as signal CLK that are provided to the control and datapath circuitry (e.g., the clock signals may be masked or blocked such that the control and datapath circuitry operations are paused or temporarily slowed). If desired, the control signals may direct the clock circuitry to reduce the frequency of the clock signals. Gating datapaths may help to reduce the amount of output data produced during error correction operations and thereby help reduce the load at data buffers such as buffers 64 and 66 of FIG. 4. For example, the size of data buffers 64 and 66 may by reduced if the optional datapath gating operations of step 105 are performed.

If desired, datapath operations may be delayed by performing down-sampling operations. For example, the error control circuitry may provide control signals to the datapath circuits that direct the datapath circuits to process only every other word of input data in order to operate at a reduced clock speed. This example is merely illustrative. The error control circuitry may direct the datapath circuits to process any subset of incoming input data to operate at a desired reduced clock speed.

During step 106, the error detection circuitry may buffer each datapath while waiting for background error checking results. For example, control circuitry 62 of FIG. 4 may direct buffers 64 and 66 to store data signals DO1 and DO2 from datapaths 54-1 and 52-2. The error detection circuitry may enable an error counter such as counter 72 to count the number of errors detected in real-time after the first detected error (e.g., the number of times that real-time error signal ERT is asserted after the initial assertion during step 102).

The error control circuitry of real-time error detection circuitry may wait for the results of background error checking operations performed by background error checking circuitry. A timer such as timer 70 of FIG. 4 may be used to define a window within which background error checking operations are expected to detect and locate the error that has been identified by real-time error signal ECRC. For example, the error control circuitry may enable timer 70 and monitor the ECRC signal during the window in which timer 70 counts down to zero. If the ECRC signal is asserted during this window, the operations of step 108 may be performed. If the ECRC signal remains de-asserted (e.g., logic zero) during this window, the error control circuitry may proceed based on the value of the error counter relative to a threshold value. The threshold value may be set to an appropriate value for differentiating between permanent and transient errors. The threshold value may, for example, be one, ten, a hundred, or any suitable value for differentiating between permanent and transient errors.

If the error counter exceeds the threshold, the error control circuitry may identify the error as a permanent error during step 108. The error may be permanent because it causes repeated datapath errors and was not detected during background error checking of programmable elements and therefore is determined to be (e.g., classified as) a permanent circuit fault (e.g., due to transistor aging and not a configuration data error). In response to identifying a permanent error, the error control circuitry may flag the permanent error to a user.

If the error counter does not exceed the threshold, the error control circuitry may identify the error as a transient error during step 110 before returning to step 102. The error may be a transient error because the error occurs only once or rarely and was not detected during background error checking and therefore is classified as a temporary error. In this scenario, the control circuitry may flag or otherwise identify the transient error and reset the system (e.g., resetting the custom user logic to a known state).

The example of FIG. 6 in which an error counter is used in differentiating between transient and permanent errors is merely illustrative. If desired, historical information on how many errors have occurred, the rate or frequency at which errors occur, or other information on the errors may be maintained by the error control circuitry. This information may be used at the end of a window of time represented by the timer in determining whether an error is a permanent or transient error (e.g., more frequently occurring errors may be indicative of a permanent fault, whereas rarely occurring errors may be indicative of a transient fault).

In response to successful error detection by background error detection circuitry during step 106 (e.g., ECRC is asserted within the timer window), the error control circuitry may identify the location of the error during step 112. The location of the error may be identified based on a configured mapping of circuit regions along with address information from signal ELOCATION. For example, information identifying the mapping of control, datapath, and error circuitry of FIG. 5 may be used along with signal ELOCATION provided from background error checking circuitry to determine whether the error is located in a control, datapath, or error circuit region (e.g., in a region 36 that implements control circuitry 52, datapath circuitry 54, or error circuitry 58).

In response to determining that the error is located in a control region, the control circuitry may ignore the error during step 114 before returning to step 102. The error may be ignored because the error circuitry is located within control circuitry that already has error resiliency (e.g., due to a triple modular redundancy arrangement in which three copies of a control circuit vote). By ignoring the error, the control circuitry may help ensure minimal disturbance to normal user logic operations while maintaining correct functionality. If desired, the control circuitry may load correct configuration data for the programmable elements of only the control circuit that has an error while maintaining normal operations of the other control circuits (e.g., by scrubbing the programmable elements, by performing a dynamic partial reconfiguration operation, etc.).

In response to determining that the error is located in a datapath region corresponding to one of the datapath circuits (e.g., datapath circuit 54-1 or 54-2), the control circuitry may determine that the data of the remaining datapath circuit is operating correctly and select the buffered output data from the remaining datapath circuit as output data signal DOUT. Use of buffered data allows the custom user logic to continue operating without interruption even when an error has occurred in a datapath. If desired, the control circuitry may load correct configuration data for the programmable elements of only the datapath circuit that has an error while maintaining normal operations of the other datapath circuits.

In response to determining that the error is located in an error region that is configured to implement real-time error detection circuitry, the control circuitry may correct the errors and reset the system. In general, the operations of step 118 may be performed in response to determining that an error is located in any region that is not dedicated to control or datapath circuitry (e.g., any region other than C1, C2, C3, D1, D2, D3, D4, D5, or D6 of FIG. 5). For example, the error may have occurred in input-output circuitry or other circuitry that may be implemented without real-time error resiliency capabilities.

Figure 7:
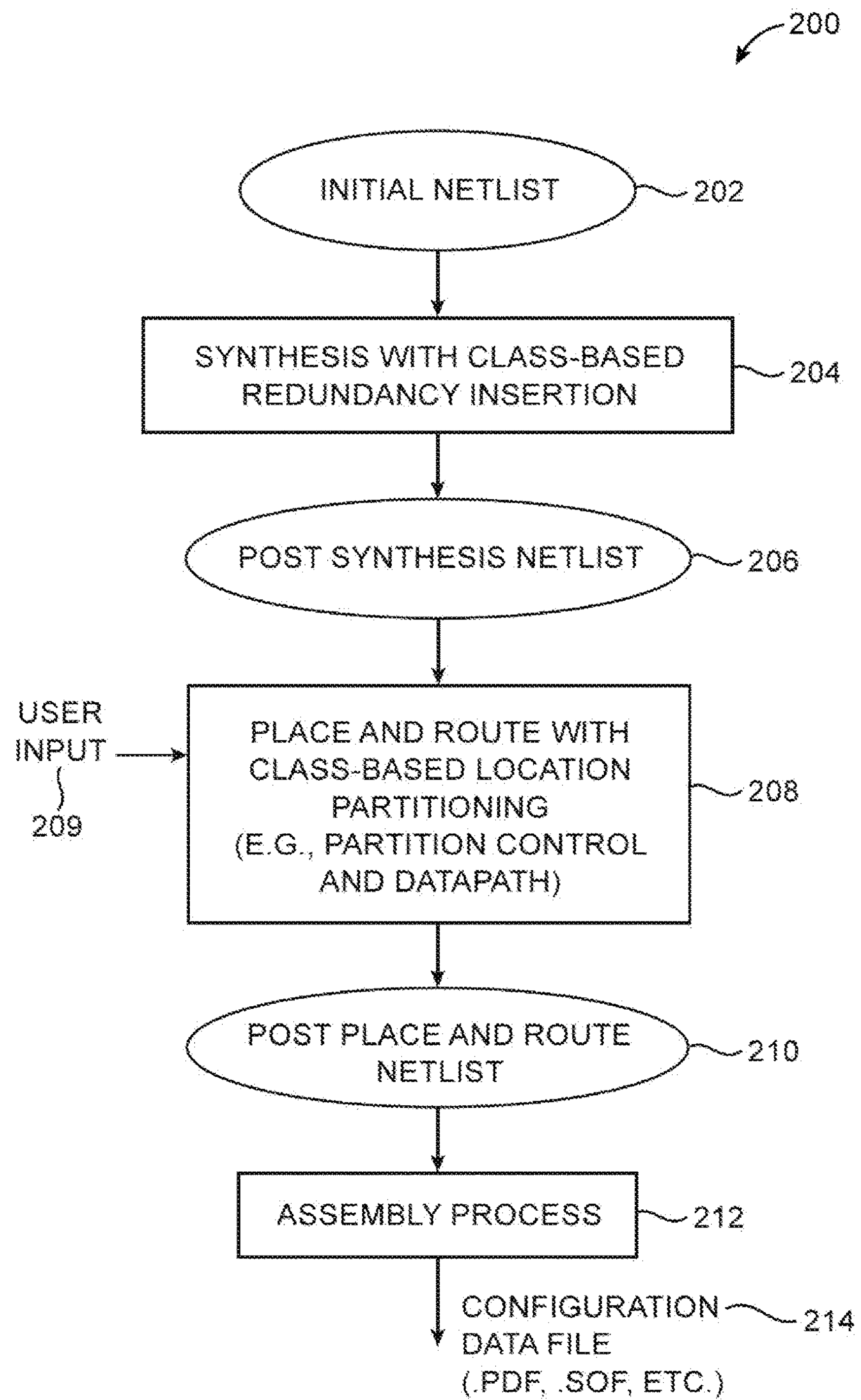
FIG. 7 is a flow chart of illustrative steps that may be performed using logic design computing equipment to generate configuration data for improved error resiliency in accordance with an embodiment of the present invention.

FIG. 7 is an illustrative flowchart 200 of operations involved in producing configuration data files that map control and datapath circuitry of custom user logic to different regions to accommodate error correction operations. The operations of flowchart 200 may be performed using tools such as computer-aided design tools. The computer-aided design tools may be implemented using computing equipment including one or more processors and storage (e.g., as software-based tools).

As shown in FIG. 7, an initial netlist 202 is synthesized at step 204 to produce a post-synthesis netlist 206. During step 204, the computer-aided design tools may identify and assign circuitry of a user design to different classes based on error handling requirements. For example, circuitry such as control circuitry that is high-priority, error-sensitive and/or performs time-sensitive operations may be assigned to a first class with increased error handling (e.g., triple modular redundancy), whereas lower-priority circuitry such as datapath circuitry may be assigned to a second class with error handling that is reduced relative to the first class. As another example, circuitry that performs peripheral or otherwise non-critical functions may be assigned to a third class with minimal or no error handling. Redundancy may be implemented for the identified circuitry based on the assigned class. For example, triple modular redundancy may be implemented for control circuitry of the first class, whereas double modular redundancy may be implemented for datapath circuitry of the second class. This example is merely illustrative. If desired, a user may provide a custom user design that includes triple modular redundancy for control circuitry and double modular redundancy for datapath circuitry. In this scenario, the computer-aided design tools may identify the control and datapath circuitry without implementing any additional redundancy structures.

At step 208, user input 209 and the post synthesis netlist 206 are processed during place and route and optimization operations. During the operations of step 208, the computer-aided design tools may identify the circuitry of the different classes (e.g., control and datapath logic in the netlist) and partition the circuitry of the different classes into different logic regions (e.g., as shown in FIG. 5). This example is merely illustrative. If desired, the computer-aided design tools may receive information from a user that identifies the circuitry of the different classes (e.g., control and datapath logic) to be partitioned into different logic regions. The resulting netlist 210 is processed further during an assembly process 212 to produce a configuration data file output 214 (e.g., a .pof or .sof file).

ADDITIONAL EMBODIMENTS

Additional Embodiment 1

A method of operating circuitry that produces an output data signal, the method including: with first and second datapath circuits, generating first and second respective data signals; with storage circuitry, buffering the first and second data signals; with real-time error detection circuitry, performing real-time error detection operations on the first and second data signals; with background error checking circuitry, performing background error checking operations during normal operation of the first and second datapath circuits; and in response to an error detected by the real-time error detection circuitry, selecting between the buffered first and second data signals to produce the output data signal based on the background error checking operations.

Additional Embodiment 2

The method defined in additional embodiment 1 wherein the circuitry includes programmable logic having programmable elements loaded with configuration data that implements the first and second datapath circuits and wherein performing the background error checking operations includes: continuously performing error-detecting code calculations in validating the configuration data.

Additional Embodiment 3

The method defined in additional embodiment 2 wherein the programmable logic includes programmable regions, wherein the first datapath circuit is implemented using a first set of programmable regions, wherein the second datapath circuit is implemented using a second set of programmable regions, and wherein performing the background error checking operations further includes: producing an error location signal that identifies which programmable region the error occurred at.

Additional Embodiment 4

The method defined in additional embodiment 3 further including: based on the error location signal, determining whether the error occurred at the first set of programmable regions that implements the first datapath circuit or whether the error occurred at the second set of programmable regions that implements the second datapath circuit; in response to determining that the error occurred at the first set of programmable regions that implements the first datapath circuit, producing the buffered second data signal as the output data signal; and in response to determining that the error occurred at the second set of programmable regions that implements the second datapath circuit, producing the buffered first data signal as the output data signal.

Additional Embodiment 5

The method defined in additional embodiment 4 wherein a third set of the programmable regions is configured to implement control circuitry in a triple modular redundancy configuration that controls the first and second datapath circuits, the method further including: based on the error location signal, determining whether the error occurred at the third set of the programmable regions that implements the control circuitry; and in response to determining that the error occurred at the third set of the programmable regions that implements the control circuitry, ignoring the error.

Additional Embodiment 6

The method defined in additional embodiment 5 further including: in response to determining that the error did not occur at the first, second, or third set of the programmable regions, loading correct configuration data in the programmable elements and resetting the circuitry.

Additional Embodiment 7

The method defined in additional embodiment 2 wherein the background error checking circuitry asserts a CRC error signal in response to identifying the error during background error checking operations, the method further including: with the real-time error detection circuitry, monitoring the CRC error signal during a window of time initialized when the error is detected.

Additional Embodiment 8

The method defined in additional embodiment 7 further including: with the real-time error detection circuitry, determining whether the error is a transient error or a permanent error at the end of the window of time.

Additional Embodiment 9

The method defined in additional embodiment 8 further including: with the real-time error detection circuitry, enabling a counter to begin incrementing a counter value in response to detecting the error, wherein determining whether the error is a transient error or a permanent error at the end of the window of time includes: with the real-time error detection circuitry, identifying the error as a transient error at the end of the window of time if the counter value is less than a threshold.

Additional Embodiment 10

The method defined in additional embodiment 9 further including: with the real-time error detection circuitry, identifying the error as a permanent error at the end of the window of time if the counter value is greater than a threshold.

Additional Embodiment 11

The method defined in additional embodiment 2 wherein performing the error-detecting code validations includes calculating cyclic redundancy checks on the configuration data.

Additional Embodiment 12

The method defined in additional embodiment 1 further including: in response to detecting the error, gating the first and second datapath circuits until completion of selecting between the buffered first and second data signals to produce the output data signal.

Additional Embodiment 13

The method defined in additional embodiment 1 further including: in response to identifying an error by the background error checking operations without any errors detected by the real-time error detection circuitry, ignoring the error.

Additional Embodiment 14

Circuitry, including: first and second datapath circuits that produce respective first and second data signals; background error checking circuitry that performs background error checking operations on the circuitry; and real-time error detection circuitry that detects errors based on the first and second data signals and determines the locations of the errors based on the background error checking operations.

Additional Embodiment 15

The circuitry defined in additional embodiment 14 further including: buffer circuitry that buffers that first and second data signals, wherein the real-time error detection selects an output signal for the circuitry from the first and second buffered data signals based on the detected errors and the determined locations of the errors.

Additional Embodiment 16

The circuitry defined in additional embodiment 15 wherein the circuitry includes programmable logic regions having programmable elements, wherein a first set of the programmable logic regions is configured to implement the first datapath circuit, and wherein a second set of the programmable logic regions is configured to implement the second datapath circuit.

Additional Embodiment 17

The circuitry defined in additional embodiment 16 further including: first, second, and third control circuits that produce respective first, second, and third control signals; and a voting circuit that receives the first, second, and third control signals and produces at least one output control signal for the first and second datapath circuits.

Additional Embodiment 18

The circuitry defined in additional embodiment 17 wherein the background error checking circuitry calculates cyclic redundancy checks on configuration data stored in the programmable elements to identify errors and produces an error location signal identifying the location of an identified error.

Additional Embodiment 19

The circuitry defined in additional embodiment 14 wherein the real-time error detection circuitry includes an XOR circuit that receives the first and second data signals and detects mismatch between the first and second data signals.

Additional Embodiment 20

A method of using logic design computing equipment to configure a programmable integrated circuit having programmable regions, the method including: receiving a custom user design; identifying control circuitry and datapath circuitry in the custom user design; duplicating the datapath circuitry to form first and second datapath circuits; and configuring first, second, and third respective and different sets of programmable regions to implement the control circuitry, the first datapath circuit, and the second datapath circuit.

Additional Embodiment 21 the method defined in additional embodiment 20 further including: configuring the first set of programmable regions to implement a triple modular redundancy arrangement of the control circuitry.

Additional Embodiment 22

The method defined in additional embodiment 20 wherein the programmable integrated circuit includes background error checking circuitry that computes cyclic redundancy checks in detecting configuration errors at the programmable regions and identifies in which programmable region each detected configuration error is located.

The foregoing is merely illustrative of the principles of this invention and various modifications can be made by those skilled in the art without departing from the scope and spirit of the invention. The foregoing embodiments may be implemented individually or in any combination.

The invention claimed is:

1. A method of operating circuitry that produces an output data signal, the method comprising:

with first and second circuits, generating first and second respective data signals;

with storage circuitry, buffering the first and second data signals;

with real-time error detection circuitry, performing real-time error detection operations on the first and second data signals;

with background error checking circuitry, performing background error checking operations during normal operation of the first and second circuits; and in response to an error detected by the real-time error detection circuitry, selecting between the buffered first and second data signals to produce the output data signal based on the background error checking operations.

2. The method defined in claim 1 wherein the first and second circuits comprise first and second datapath circuits, wherein the circuitry comprises programmable logic having programmable elements loaded with configuration data that implements the first and second datapath circuits, and wherein performing the background error checking operations comprises:

continuously performing error-detecting code calculations in validating the configuration data.

3. The method defined in claim 2 wherein the programmable logic comprises programmable regions, wherein the first datapath circuit is implemented using a first set of programmable regions, wherein the second datapath circuit is implemented using a second set of programmable regions, and wherein performing the background error checking operations further comprises:

producing an error location signal that identifies which programmable region the error occurred at.

4. The method defined in claim 3 further comprising:

based on the error location signal, determining whether the error occurred at the first set of programmable regions that implements the first datapath circuit or whether the error occurred at the second set of programmable regions that implements the second datapath circuit;

in response to determining that the error occurred at the first set of programmable regions that implements the first datapath circuit, producing the buffered second data signal as the output data signal; and in response to determining that the error occurred at the second set of programmable regions that implements the second datapath circuit, producing the buffered first data signal as the output data signal.

5. The method defined in claim 4 wherein a third set of the programmable regions is configured to implement control circuitry in a triple modular redundancy configuration that controls the first and second datapath circuits, the method further comprising:

based on the error location signal, determining whether the error occurred at the third set of the programmable regions that implements the control circuitry; and in response to determining that the error occurred at the third set of the programmable regions that implements the control circuitry, ignoring the error.

6. The method defined in claim 5 further comprising:

in response to determining that the error did not occur at the first, second, or third set of the programmable regions, loading correct configuration data in the programmable elements and resetting the circuitry.

7. The method defined in claim 2 wherein the background error checking circuitry asserts a CRC error signal in response to identifying the error during background error checking operations, the method further comprising:

with the real-time error detection circuitry, monitoring the CRC error signal during a window of time initialized when the error is detected.

8. The method defined in claim 7 further comprising:

with the real-time error detection circuitry, determining whether the error is a transient error or a permanent error at the end of the window of time.

9. The method defined in claim 8 further comprising:

with the real-time error detection circuitry, enabling a counter to begin incrementing a counter value in response to detecting the error, wherein determining whether the error is a transient error or a permanent error at the end of the window of time comprises:

with the real-time error detection circuitry, identifying the error as a transient error at the end of the window of time if the counter value is less than a threshold.

10. The method defined in claim 9 further comprising:

with the real-time error detection circuitry, identifying the error as a permanent error at the end of the window of time if the counter value is greater than a threshold.

11. The method defined in claim 2 wherein performing the error-detecting code validations comprises calculating cyclic redundancy checks on the configuration data.

12. The method defined in claim 1 further comprising:

in response to detecting the error, gating the first and second circuits until completion of selecting between the buffered first and second data signals to produce the output data signal.

13. The method defined in claim 1 further comprising:

in response to identifying an error by the background error checking operations without any errors detected by the real-time error detection circuitry, ignoring the error.

14. Circuitry, comprising:

first and second circuits that produce respective first and second data signals;

background error checking circuitry that performs background error checking operations on the circuitry; and real-time error detection circuitry that detects errors based on the first and second data signals and determines the locations of the errors based on the background error checking operations.

15. The circuitry defined in claim 14 wherein the first and second circuits are assigned to a first circuitry class having a first error sensitivity level and wherein the first and second circuits form a double modular redundancy arrangement, the circuitry further comprising:

third, fourth, and fifth circuits assigned to a second circuitry class having a second error sensitivity level that is greater than the first error sensitivity level, wherein the third, fourth, and fifth circuits form a triple modular redundancy arrangement.

16. The circuitry defined in claim 14 further comprising:

buffer circuitry that buffers that first and second data signals, wherein the real-time error detection selects an output signal for the circuitry from the first and second buffered data signals based on the detected errors and the determined locations of the errors.

17. The circuitry defined in claim 16 wherein the circuitry comprises programmable logic regions having programmable elements, wherein a first set of the programmable logic regions is configured to implement the first circuit, and wherein a second set of the programmable logic regions is configured to implement the second circuit.

18. The circuitry defined in claim 17 wherein the first and second circuits comprise first and second datapath circuits, the circuitry further comprising:

first, second, and third control circuits that produce respective first, second, and third control signals; and a voting circuit that receives the first, second, and third control signals and produces at least one output control signal for the first and second datapath circuits.

19. The circuitry defined in claim 18 wherein the background error checking circuitry calculates cyclic redundancy checks on configuration data stored in the programmable elements to identify errors and produces an error location signal identifying the location of an identified error.

20. The circuitry defined in claim 14 wherein the real-time error detection circuitry comprises an XOR circuit that receives the first and second data signals and detects mismatch between the first and second data signals.

* * * * *